United States Patent
Kim et al.

(10) Patent No.: US 11,495,320 B2
(45) Date of Patent: Nov. 8, 2022

(54) STORAGE DEVICE INCLUDING POWER SUPPLY CIRCUIT AND METHOD OF OPERATING STORAGE DEVICE

(71) Applicant: SAMSUNG ELECTRONICS CO., LTD., Suwon-si (KR)

(72) Inventors: Heejong Kim, Seoul (KR); Gunbae Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/169,643

(22) Filed: Feb. 8, 2021

(65) Prior Publication Data

US 2021/0257041 A1 Aug. 19, 2021

(30) Foreign Application Priority Data

Feb. 13, 2020 (KR) .................. 10-2020-0017902

(51) Int. Cl.
*G11C 29/00* (2006.01)
*G11C 29/42* (2006.01)
(Continued)

(52) U.S. Cl.
CPC .............. *G11C 29/42* (2013.01); *G11C 16/14* (2013.01); *G11C 16/26* (2013.01); *G11C 16/30* (2013.01);
(Continued)

(58) Field of Classification Search
CPC ......... G11C 16/14; G11C 16/26; G11C 16/30; G11C 29/12005; G11C 29/12015;
(Continued)

(56) References Cited

U.S. PATENT DOCUMENTS 9,417,961 B2 8/2016 Dash et al.
9,684,359 B2 6/2017 Kunishige
(Continued)

FOREIGN PATENT DOCUMENTS

KR 10-20140025013 3/2014
KR 10-1652936 9/2016
KR 10-1876001 7/2018

OTHER PUBLICATIONS

European Search Report dated Jul. 14, 2021, Cited in EP Patent Application No. 21152115.8.

*Primary Examiner* — Thong Q Le
(74) *Attorney, Agent, or Firm* — Volentine, Whitt & Francos, PLLC

(57) ABSTRACT

A storage device includes a power supply circuit that receives a power disable signal from a host device and provides a first internal voltage and a second internal voltage, a non-volatile memory including a memory device, and a storage controller that controls the non-volatile memory and includes a processor that performs a data recovery operation on data stored in the memory device and a host interface that communicates with the host device. When the power disable signal is activated at a power off time, the storage controller is powered off, the power supply circuit interrupts the first internal voltage and the second internal voltage during a reference time following the power off time, and provides the first internal voltage to the processor after the reference time has elapsed following the power off time.

20 Claims, 13 Drawing Sheets

(51) Int. Cl.
*G11C 16/14* (2006.01)
*G11C 16/26* (2006.01)
*G11C 16/30* (2006.01)
*G11C 29/12* (2006.01)
*G11C 29/44* (2006.01)

(52) U.S. Cl.
CPC .. *G11C 29/12005* (2013.01); *G11C 29/12015* (2013.01); *G11C 29/44* (2013.01)

(58) Field of Classification Search
CPC ..... G11C 29/42; G11C 29/44; G11C 16/0483; G11C 2207/105; G11C 5/025; G11C 5/04; G11C 5/063; G11C 7/02; G11C 7/1048; G06F 3/0619; G06F 3/0625; G06F 3/0634; G06F 3/0659; G06F 3/0679; G06F 1/26; G06F 3/0616; G06F 3/0658

See application file for complete search history.

(56) References Cited

U.S. PATENT DOCUMENTS

| | | | |
|---|---|---|---|
| 9,946,329 | B2 | 4/2018 | Shimizu et al. |
| 10,394,741 | B2 | 8/2019 | Suto |
| 10,955,891 | B2 * | 3/2021 | Nam ........................ G06F 1/266 |
| 2018/0239696 | A1 | 8/2018 | Lim et al. |
| 2019/0050034 | A1 | 2/2019 | Wang et al. |
| 2019/0196834 | A1 | 6/2019 | Blasco et al. |
| 2019/0227611 | A1 * | 7/2019 | Nam ........................ G06F 1/305 |
| 2019/0245291 | A1 | 8/2019 | Wang et al. |
| 2020/0042207 | A1 | 2/2020 | Kwak |

\* cited by examiner

STORAGE DEVICE INCLUDING POWER SUPPLY CIRCUIT AND METHOD OF OPERATING STORAGE DEVICE

CROSS-REFERENCE TO RELATED APPLICATION

This application claims the benefit of Korean Patent Application No. 10-2020-0017902 filed on Feb. 13, 2020 in the Korean Intellectual Property Office, the subject matter of which is hereby incorporated by reference.

BACKGROUND

The inventive concept relates to storage devices and methods of operating same. More particularly, the inventive concept relates to a storage device including a power supply circuit and method of operating the storage device.

Non-volatile memory may retain stored data in the absence of applied power. In recent years, storage devices including a flash-based non-volatile memory, such as an embedded multimedia card (eMMC), a universal flash storage (UFS), a solid-state drive (SSD), and a memory card, have been widely used. The storage devices may be effectively used to store relatively large amounts of data.

However, when a storage device is maintained in a power-off state, variation(s) in the threshold voltage of constituent memory cells that are not frequently accessed by a host device may vary, thereby causing a loss of data. This phenomenon increases in prevalence as data retention time increase.

SUMMARY

Embodiments of the inventive concept provide storage devices having improved data retention characteristics, as well as methods of operating such storage devices.

According to an aspect of the inventive concept, there is provided a storage device including; a power supply circuit that receives a power disable signal from a host device and provides a first internal voltage and a second internal voltage, a non-volatile memory including a memory device, and a storage controller that controls the non-volatile memory and includes a processor that performs a data recovery operation on data stored in the memory device and a host interface that communicates with the host device. When the power disable signal is activated at a power off time, the storage controller is powered off, the power supply circuit interrupts the first internal voltage and the second internal voltage during a reference time following the power off time, and provides the first internal voltage to the processor after the reference time has elapsed following the power off time.

According to an aspect of the inventive concept, there is provided a storage device including; a power supply circuit that receives a power disable signal and an external voltage from a host device and provides a first internal voltage, a second internal voltage and a third internal voltage, a non-volatile memory including a memory device, and a storage controller that controls the non-volatile memory and includes a first processor that receives the first internal voltage, a host interface that receives the second internal voltage and communicates with the host device, and a second processor that receives the third internal voltage and controls operation of the storage controller. When, at a power off time, a power disable signal is activated, the power supply circuit interrupts the first internal voltage, the second internal voltage and the third internal voltage to power off the storage controller and the non-volatile memory, and after a reference time following the power off time, the power supply circuit periodically provides the first internal voltage to the first processor and the first processor performs a data recovery operation on data stored in the non-volatile memory.

According to an aspect of the inventive concept, there is provided a method of operating a storage device including a non-volatile memory including a memory device and a storage controller including a processor and a host interface. The method includes; upon receiving an activated power disable signal from a host device at a power off time, powering off the storage controller to place the processor and the host interface in a power off state, determining whether a reference time has elapsed following the power off time, and upon determining that the reference time has elapsed following the power off time, providing an internal voltage to the processor to place the processor in a power on state such that the processor performs a data recovery operation on data stored in the memory device, and maintaining the power off state of the host interface.

According to an aspect of the inventive concept, there is provided a method of operating a storage device including a non-volatile memory and a storage controller including a processor and a host interface. The method includes; receiving a power disable signal from a host device, operating the storage device in a power disable function activation mode when the power disable signal is activated and operating the storage device in a power disable function inactivation mode when the power disable signal is inactivated. The operating of the storage device in the power disable function activation mode includes; powering off the processor and the host interface at a power off time, powering on the processor after a reference time has elapsed following the power off time, using the processor to perform a data recovery operation on data stored in the non-volatile memory, and powering off the processor when the data recovery operation is completed.

BRIEF DESCRIPTION OF THE DRAWINGS

Embodiments of the inventive concept may be more clearly understood upon consideration of the following detailed description taken in conjunction with the accompanying drawings in which.

DETAILED DESCRIPTION

Throughout the written description and drawings, like reference numbers and labels denote like or similar elements and/or features.

Figure 1:
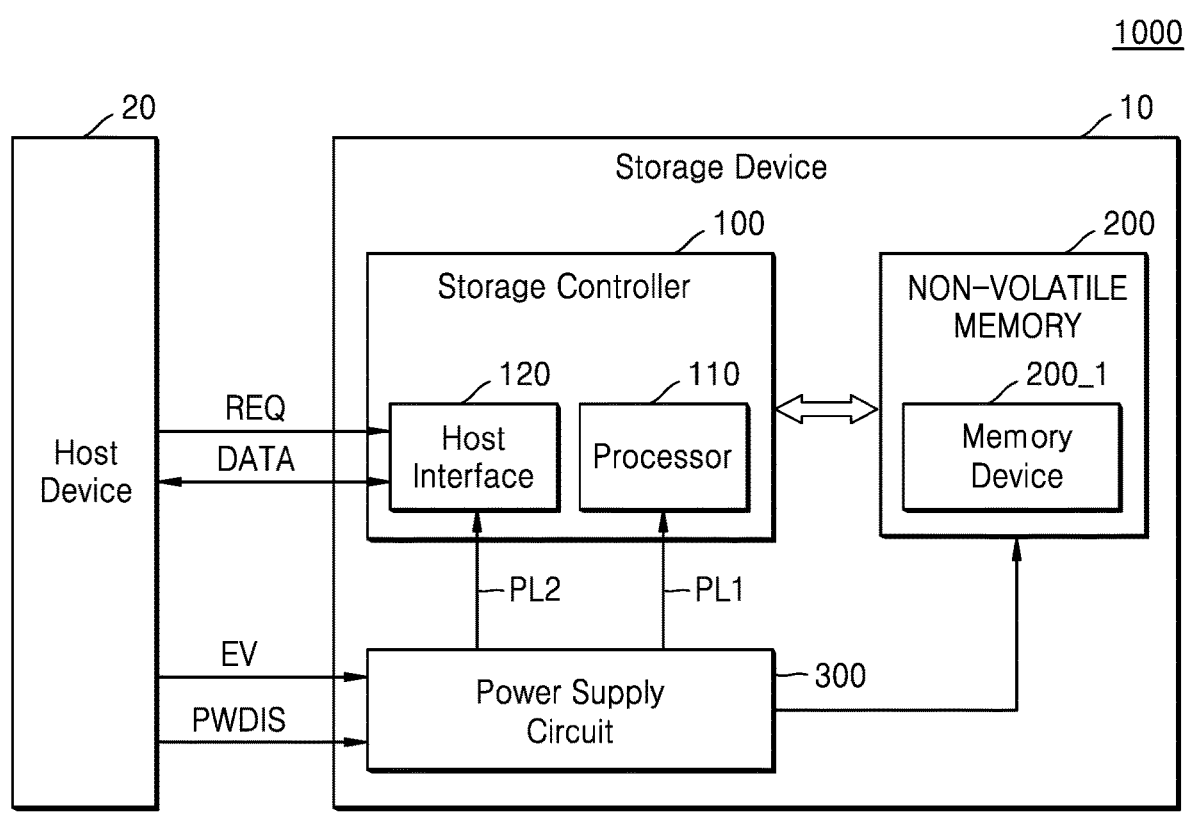
FIG. 1 is a block diagram illustrating in one example (1000) a storage system according to embodiments of the inventive concept.

Figure (FIG. 1 is a block diagram illustrating in one example (1000) a storage system according to embodiments of the inventive concept.

Referring to FIG. 1, the storage system 1000 may generally include a storage device 10 and a host device 20. Although FIG. 1 assumes a case in which the storage device 10 is a sold-state drive (SSD) device, the inventive concept is not limited thereto, and the storage device 10 may one of any number of storage device types capable of receiving, storing and/or retrieving data. In an example embodiment, the host device 20 may be implemented as an application processor (AP) or a System-On-a-Chip (SoC). The host device 20 may communicate with the storage device 10 through a host interface 120.

The storage device 10 may generally include a storage controller 100, a power supply circuit 300 and a non-volatile memory 200. The storage controller 100 may be used to control the overall operation of the power supply circuit 300 and the non-volatile memory 200.

The storage controller 100 may receive a request (REQ) (e.g., a read request, a write request, etc.) provide by the host device 20 and in response to the request, transmit data to and/or receive data from the host device 20. The storage controller 100 may provide data (DATA) stored in the non-volatile memory 200 to the host device 20 in response to a read request. Alternatively, the storage controller 100 may control the non-volatile memory 200 to write data received from the host device 20 in the non-volatile memory 200 in response to a write request.

The power supply circuit 300 may receive an external voltage (EV) from the host device 20 through an external power line. Although a single external voltage is assumed for the illustrated example of FIG. 1, the inventive concept is not limited thereto, and the power supply circuit 300 may receive a number of external voltages through one or more external power lines. For instance, the power supply circuit 300 may respectively receive a first external voltage and a second external voltage through a first external power line and a second external power line.

The power supply circuit 300 may generate one or more internal voltage(s) from the external voltage(s), as required by various operations performed by the storage controller 100 and/or the non-volatile memory 200. For example, the power supply circuit 300 may provide a first internal voltage to a processor 110 of the storage controller 100 through a first power line PL1, and provide a second internal voltage to the host interface 120 of the storage controller 100 through a second power line PL2.

The power supply circuit 300 may also receive a power disable signal (PWDIS) from the host device 20, and selectively activate a power disable function in response to the power disable signal. For example, the power supply circuit 300 may receive a power disable signal through a third external power line.

When the power disable signal is inactivated, the power supply circuit 300 may operate in a power disable function inactivation mode. In the power disable function inactivation mode, the power supply circuit 300 provides the internal voltage(s) to the storage controller 100 and the non-volatile memory 200 in order to place the storage controller 100 and the non-volatile memory 200 in a power-on state. For example, when the power supply circuit 300 receives a low-level power disable signal, the power supply circuit 300 may respectively provide the internal voltage(s) to the storage controller 100 and the non-volatile memory 200 in order to power-on the storage controller 100 and the non-volatile memory 200.

In contrast, when the power disable signal is activated, the power supply circuit 300 may operate in a power disable function activation mode. In the power disable function activation mode, the power supply circuit 300 will not provide the internal voltage(s) to the storage controller 100 and the non-volatile memory 200, and the storage controller 100 and the non-volatile memory 200 are in a power-off state. For example, when the power supply circuit 300 receives a high-level power disable signal, the power supply circuit 300 may power off the storage controller 100 and the non-volatile memory 200.

In the power disable function activation mode, the power supply circuit 300 may periodically provide power to the processor 110. That is, the power supply circuit 300 may periodically provide the first internal voltage to the processor 110 through a first internal voltage line. In this regard, the power supply circuit 300 may include a timer. When a reference time has elapsed from a power-off time (e.g., a point in time at which the storage controller 100 and the non-volatile memory 200 are powered off), the power supply circuit 300 may again provide (or re-provide) power to the processor 110.

However, in the power disable function activation mode, the power supply circuit 300 may not provide power to the host interface 120 by interrupting the second internal voltage otherwise provided to the host interface 120. Accordingly, the host device 20 may recognize the power disable function of the storage device 10 as being activated.

Even when the power disable function is activated, the storage device 10 according to embodiments of the inventive concept may periodically provide the first internal voltage to the processor 110, and thus, the processor 110 may periodically perform, as necessary, a data recovery operation on the non-volatile memory 200. In this regard it should be noted that read errors caused by retention errors may occur when the storage device 10 is maintained in a power-off state, but the possibility of this outcome may be reduced (and the lifespan of the storage device 10 may be increased) by performing the data recovery operation on the non-volatile memory 200.

The non-volatile memory 200 may be used as a storage medium of the storage device 10. The non-volatile memory 200 may be connected to the storage controller 100 through a plurality of channels. In example embodiments, the non-volatile memory 200 may include one or more memory device(s) 200_1.

Here, when the non-volatile memory 200 includes flash memory, the flash memory may include a two-dimensional (2D) NAND memory array and/or a three-dimensional (3D) (or vertical) NAND (VNAND) memory array. The 3D memory array may be monolithically formed in at least one physical level of a circuit associated with operations of arrays of memory cells having an active region provided above a silicon substrate or operations of the memory cells, wherein the associated circuit may be above or within the silicon substrate. In this regard, the term "monolithic" means that layers of each level of the 3D memory array are directly deposited on the layers of each underlying level of the 3D memory array.

In an example embodiment, the 3D memory array may include vertical NAND strings in which at least one memory cell is located on another memory cell in a vertical direction. The at least one memory cell may include a charge trap layer.

In an example embodiment, the non-volatile memory 200 may include various other types of non-volatile memories. For example, the non-volatile memory 200 may include a non-volatile memory. The non-volatile memory may include various kinds of memories, such as magnetic random access memory (MRAM), spin-transfer torque MRAM, conductive bridging RAM (CBRAM), ferroelectric RAM (FeRAM), phase-change RAM (PRAM), resistive RAM (RRAM), nanotube RAM, polymer RAM (PoRAM), nano floating gate memory (NFGM), a holographic memory, a molecular electronics memory, or an insulator resistance change memory.

In an example embodiment, the memory device(s) 200_1 of the non-volatile memory 200 may include at least one type of memory cell, such as a single-level memory cell (SLC) capable of storing 1-bit data and/or at least one multi-level cell memory (MLC) capable of storing data of 2 bits or more. For example, the memory device(s) 200_1 may include SLC and/or MLC (e.g., MLC capable of storing 2-bit data, 3-bit data, and/or 4-bit data).

In an example embodiment, when a power disable function is activated in the storage device 10, a data recovery operation may be independently performed on each of the memory device(s) 200_1. In this case, during a power disable function activation mode, a data recovery operation may be performed in relatively shorter or longer cycle(s) for memory device(s) including constituent memory cell(s) used to store relatively less or more bits.

Figure 2:
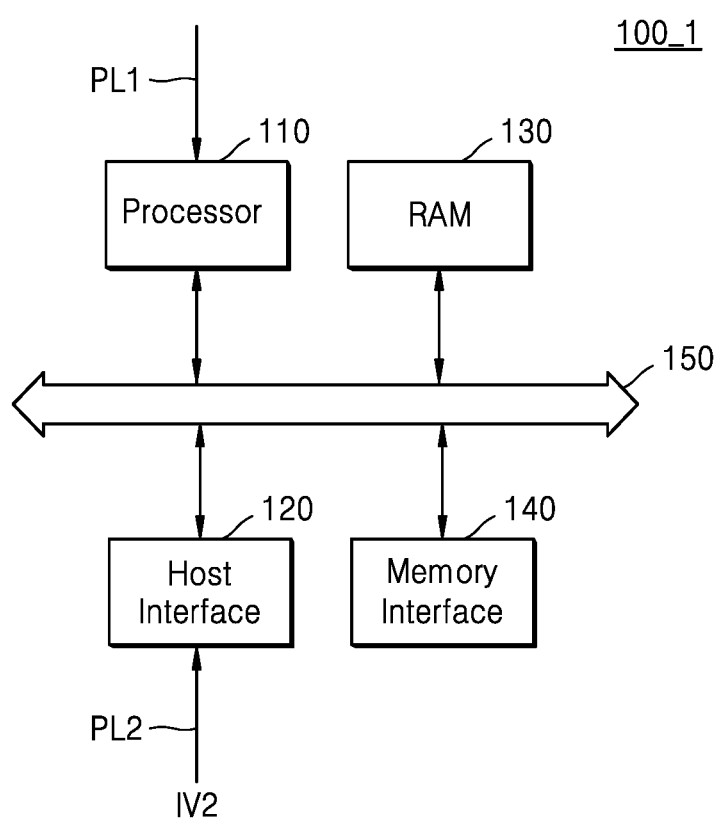
FIG. 2 is a block diagram further illustrating in one example (100_1) the storage controller of FIG. 1 according to embodiments of the inventive concept.

FIG. 2 is a block diagram further illustrating in one example (100_1) the storage controller 100 of FIG. 1 according to embodiments of the inventive concept.

Referring to FIGS. 1 and 2, the storage controller 100_1 may include a processor 110, a host interface 120, a random access memory (RAM) 130 and a memory interface 140. The processor 110, host interface 120, RAM 130, and memory interface 140 may communicate with each other through a bus 150. In addition, the storage controller 100 may further include other peripheral devices not shown in FIG. 2.

The processor 110 may be used to control the overall operation of the storage controller 100. The processor 110 may include a central processing unit (CPU) or a microprocessor (MP). The processor 110 may drive firmware for driving the storage controller 100. The firmware may be loaded in the RAM 130 and driven by the processor 110. For example, the processor 110 may drive firmware driving the storage controller 100 and a constituent flash translation layer (FTL) and controlling the execution of various operations, such as the data recovery operation, a garbage collection operation, an address mapping operation, a memory cell wear-leveling operation, etc.

The host interface 120 may communicate with the host device 20. For example, the host interface 120 may provide a physical connection between the host device 20 and the storage device 10.

The host interface 120 may adjust one or more characteristics (e.g., format, timing, size, etc.) for data, command(s) and/or address(es) exchanged between the storage device 10 and the storage device 10. For example, the host interface 120 may function as a physical layer interface. The bus format of the host device 20 may include at least one of universal serial bus (USB), small computer system interface (SCSI), peripheral component interconnect (PCI) express (PCIe), advanced technology attachment (ATA), parallel ATA (PATA), serial ATA (SATA), and serial attached SCSI (SAS). In an example embodiment, the host interface 120 may include a non-volatile memory express (NVMe) protocol mounted on the host device 20 configured to exchange data according to PCIe.

The processor 110 receives a first internal voltage IV1 from the power supply circuit 300 through a first internal power line PL1, and the host interface 120 receives a second internal voltage IV2 from the power supply circuit 300 through a second internal power line PL2. In an example embodiment, the first internal voltage IV1 and the second internal voltage IV2 may have the same voltage level. However, the inventive concept is not limited thereto, and the first internal voltage IV1 and the second internal voltage IV2 may have different voltage levels.

When a power disable function is activated, the first internal voltage IV1 and the second internal voltage IV2 supplied to the processor 110 and the host interface 120 may be interrupted. In an example embodiment, when a reference time has elapsed following a power-off time (e.g., after activation of the power disable function), the first internal voltage IV1 may be temporarily supplied to the processor 110, and thus, the processor 110 may drive the firmware to enable a data recovery operation. In contrast, when the power disable function is activated, the second internal voltage IV2 supplied to the host interface 120 may be interrupted. Accordingly, the host device 20 may recognize the power disable function of the storage device 10 as being activated and simultaneously, the data recovery operation may be periodically performed in the storage device 10. In this manner, deterioration of the data stored in the storage device 10 (e.g., due to increased retention time) may be prevented for the non-volatile memory 200.

The RAM 130 may operate under the control of the processor 110. The RAM 130 may be used as an operating memory, a cache memory, and/or a buffer memory for the processor 110. Software and firmware controlling the storage controller 100 may be loaded to the RAM 130. The RAM 130 may be implemented as a volatile memory, using (e.g.,) a dynamic RAM (DRAM) and/or static RAM (SRAM). Alternatively, the RAM 130 may be implemented as a resistive memory, such as RRAM, PRAM, or MRAM.

In an example embodiment, the RAM 130 may be used as an operating memory, and a FTL mapping table may be loaded to the RAM 130. Here, the FTL may include various modules configured to perform various functions. For instance, the FTL may include an address translation module configured to transform a logical address received from the host device 20 into a physical address indicating a position at which the non-volatile memory 200 is stored. The FTL may also include modules configured perform various background operations in relation to the non-volatile memory 200, such as the data recovery operation, a garbage collection operation, etc. The mapping table may be operated by the FTL, and a logical address and a physical address corresponding thereto may be mapped to each other and stored in the mapping table.

In an example embodiment, the RAM 130 may be used as a buffer memory to temporarily store data. For example, the data temporarily stored in the RAM 130 may subsequently be written to the non-volatile memory 200 or transmitted to the host device 20.

The memory interface 140 may be used to control the exchange of data with the non-volatile memory 200. As the storage controller 100 performs a data recovery operation, the memory interface 140 may write recovered data to the non-volatile memory 200 via a channel.

In an example embodiment, memory controller 100 may further include an error correction code (ECC) block and a redundant array of independent disks (RAID) recovery block. The ECC block may detect and correct errors included in data read from the non-volatile memory. The RAID recovery block may read data and a RAID parity, which are included in a RAID stripe, and perform a RAID recovery operation using the read data and RAID parity.

Figure 3:
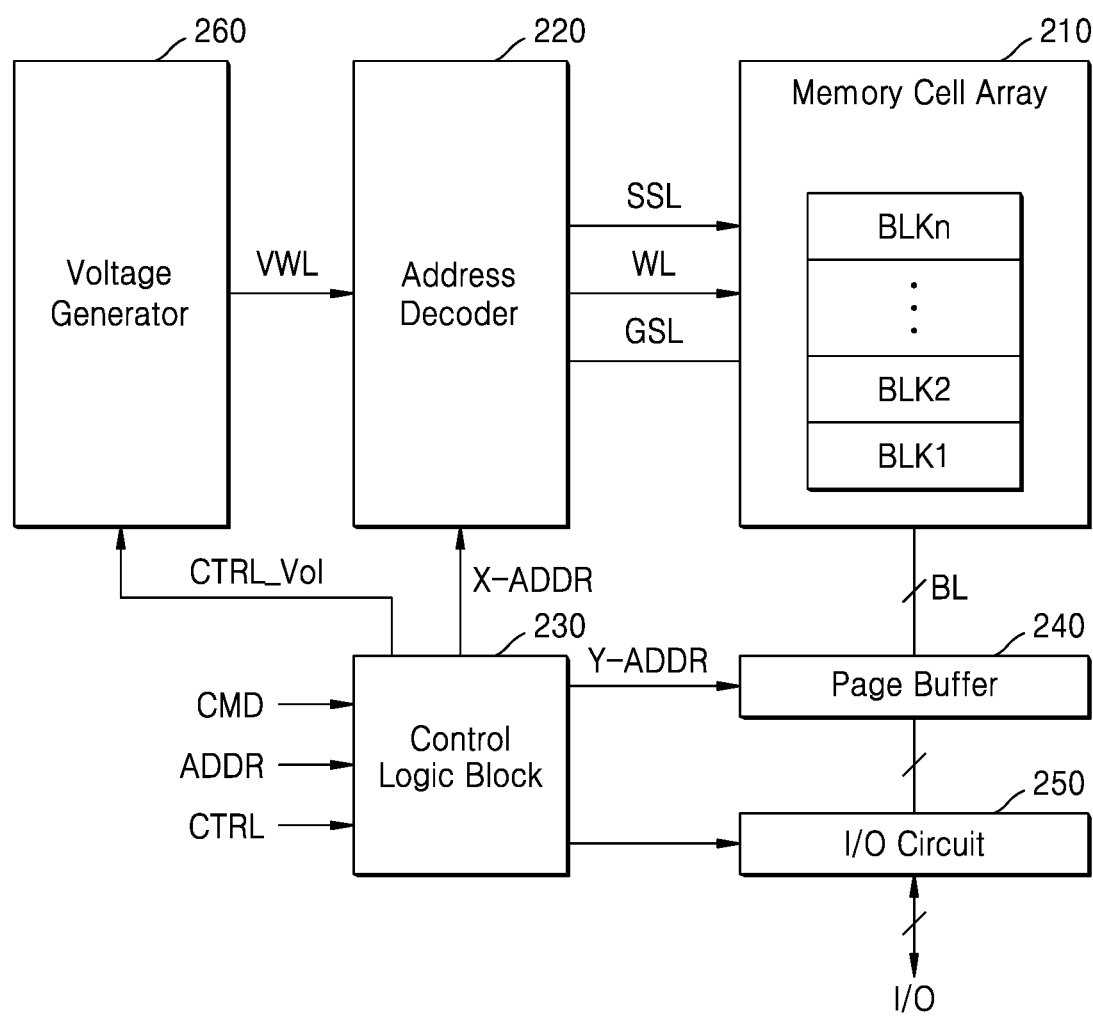
FIG. 3 is a block diagram further illustrating in one example (200_1) the memory device 200 of FIG. 1 according to embodiments of the inventive concept.

FIG. 3 is a block diagram further illustrating the memory device 200_1 of the non-volatile memory 200 of FIG. 1 according to embodiments of the inventive concept. Here, the memory device 200_1 may include one or more discreate memory devices.

Referring to FIGS. 1 and 3, the memory device 200_1 may include a memory cell array 210, an address decoder 220, a control logic block 230, a page buffer 240, an input/output (I/O) circuit 250, and a voltage generator 260. Although not shown, the memory device 200_1 may further include an I/O interface.

The memory cell array 210 may be connected to word lines WL, string selection lines SSL, ground selection lines GSL, and bit lines BL. The memory cell array 210 may be connected to the address decoder 220 through the word lines WL, the string selection lines SSL, and the ground selection lines GSL and be connected to the page buffer 240 through the bit lines BL. The memory cell array 210 may include a plurality of memory blocks BLK1 to BLKn.

Each of the memory blocks BLK1 to BLKn may include a plurality of memory cells and a plurality of selection transistors. The memory cells may be connected to the word lines WL, and the selection transistors may be connected to the string selection lines SSL or the ground selection lines GSL. The memory cells of each of the memory blocks BLK1 to BLKn may include SLC and/or MLC.

In an example embodiment, each of the memory blocks BLK1 to BLKn may include a plurality of pages. For example, a memory block may be characterized by an erase unit (e.g., a block), and a read/write unit (e.g., a page)

The address decoder 220 may select one of the memory blocks BLK1 to BLKn of the memory cell array 210, select one of the word lines WL of the selected memory block, and select one of the string selection lines SSL.

The control logic block 230 may provide various control signals for performing program, read, and erase operations on the memory cell array 210, in response to command(s) CMD, address(es) ADDR, and/or control signal(s) CTRL. For example, the control logic block 230 may provide a row address X-ADDR to the address decoder 220, a column address Y-ADDR to the page buffer 240, and a voltage control signal CTRL_Vol to the voltage generator 260.

The control logic block 230 may perform a data recovery operation in response to a command CMD received from the storage controller 100. For example, the control logic block 230 may read data from a specific page of a specific block, provide the read data to the storage controller 100, receive data in which an error has been corrected, and write the corrected data to a new free memory block. An exemplary data recovery operation for the storage device 10 will be described in some additional detail hereafter with reference to FIG. 7.

The control logic block 230 may perform a garbage collection operation in response to the command received from the storage controller 100. For example, to perform the garbage collection operation, the control logic block 230 may copy data from a valid page of a sacrificial block selected from the memory blocks BLK1 to BLKn, to a target block, and then erase the sacrificial block.

The page buffer 240 may operate as a write driver or a sense amplifier according to an operation mode. During a read operation, the page buffer 240 may sense bit lines BL of a selected memory cell via the control of the control logic block 230. Sensed data may be stored in latches included in the page buffer 240. The page buffer 240 may dump the data stored in the latches into the I/O circuit 250 via the control of the control logic block 230.

The I/O circuit 250 may temporarily store a command CMD, an address ADDR, a control signal CTRL, and/or data DATA provided through one or more I/O line(s) from an external source. The I/O circuit 250 may temporarily store read data retrieved from the memory device 200_1 and output the read data through the I/O line(s) to an external source.

The voltage generator 260 may be used to generate various voltages used during the execution of various operations (e.g., program, erase, and erase operations) by the memory cell array 210 in response to the voltage control signal CTRL_Vol. For example, the voltage generator 260 may generate a word line voltage VWL, a program voltage, a read voltage, a pass voltage, an erase verification voltage, and/or a program verification voltage. Also, the voltage generator 260 may generate a string selection line voltage and a ground selection line voltage based on the voltage control signal CTRL_Vol. Furthermore, the voltage generator 260 may generate an erase voltage to be provided to the memory cell array 210.

Figure 4:
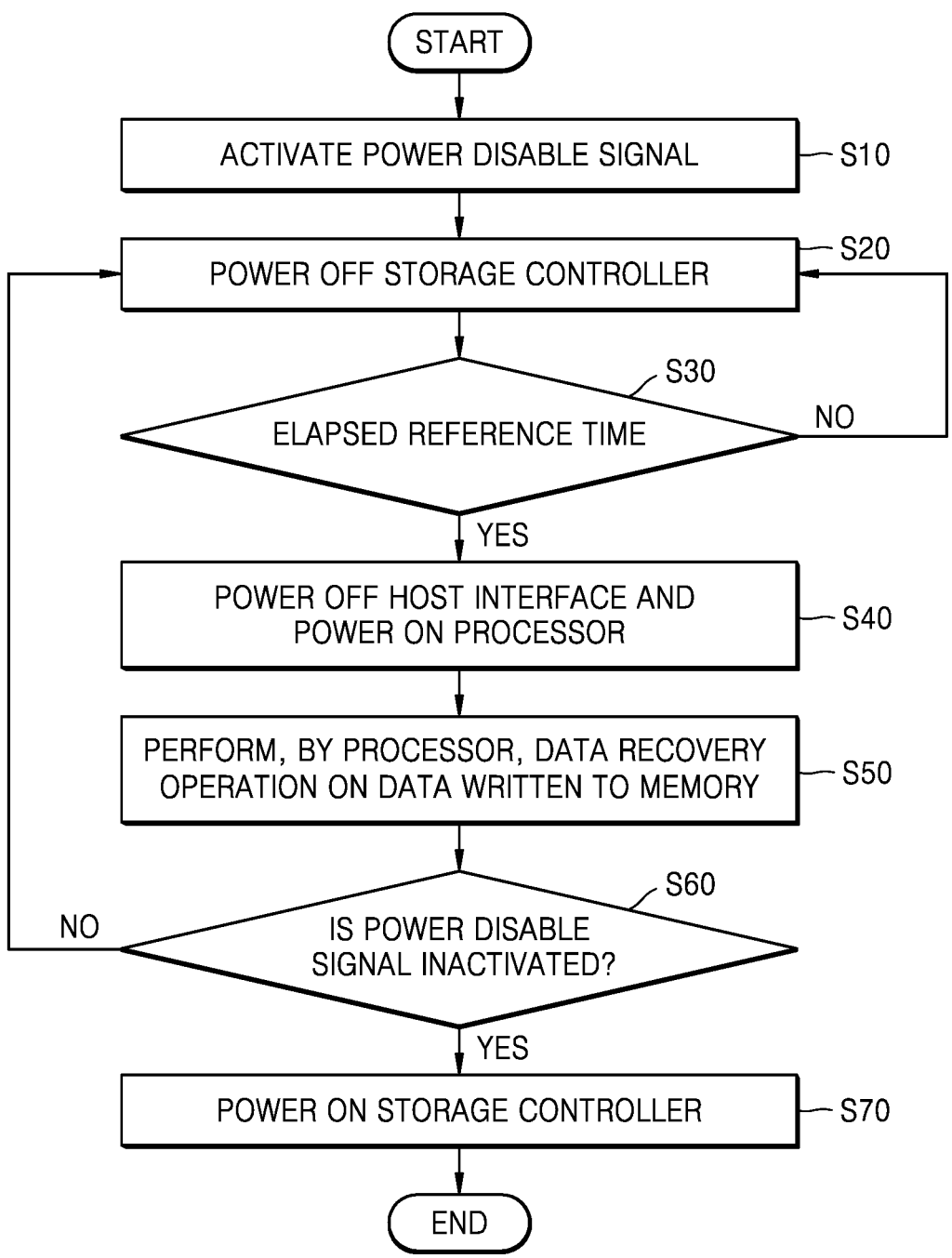
FIG. 4 is a flowchart summarizing in one example a method of operating a storage device according to embodiments of the inventive concept.

FIG. 4 is a flowchart summarizing in one example a method of operating the storage device 10 of FIG. 1 according to embodiments of the inventive concept. Here, the operations S20, S30, S40 and S50 correspond to a method of operating the storage device 10 during a power disable function activation mode.

Referring to FIGS. 1 and 4, the power disable signal is activated (S10). For example, when the power disable signal changes from a low level to a high level, the storage device 10 may determine that the power disable signal is activated.

In response to the power disable signal, the storage device 10 may power off the storage controller 100 (S20). That is, the power supply circuit 300 may interrupt one or more internal voltage(s) provided to the storage controller 100 and/or the non-volatile memory 200.

Then, the storage device 10 determines whether a reference time has elapsed since the power off time for the storage controller 100 (S30). So long as the elapsed time is less than the reference time (S30=NO), the power supply circuit 300 causes the storage controller 100 to remain in the power-off state.

In an example embodiment, the duration of the reference time depends on characteristics of the constituent memory cell(s) used to store data in the memory device 200_1. That is, as a number of data bits stored in the constituent memory cell increases, the duration of the reference time corresponding to the memory cells may be reduced. In an example embodiment, as a period of use for the storage device 10 elapses, the reference time may be reduced.

However, once the reference time has elapsed since the power off time (S30=YES), the storage device 10 may power on the processor 120 while maintaining the power-off state for the host interface 120 (S40). For example, the power supply circuit 300 may provide the first internal voltage IV1 to the processor 110 through the first internal power line PL1, but may not provide the second internal voltage IV2 to the host interface 120.

That is, the storage device 10 may power on components other than the host interface 120 during S40. For example, the storage device 10 may power on components configured to perform a data recovery operation. In contrast, because the host interface 120 is maintained in a power-off state, the host device 20 may determine that a power enable function of the storage device 10 is activated.

Accordingly, the storage device 10 may perform the data recovery operation on data stored in the memory device 200_1 (S50) as the processor 110 is powered on.

The storage device 10 may perform a data recovery operation on data stored in the memory device 200_1 in accordance with the passing of a particular reference time. For example, a first reference time corresponding to SLC may be longer than a second reference time corresponding to MLC. Thus, a data recovery operation for a memory device including MLC may be performed more frequently than a data recovery operation for a memory device including SLC.

Additionally in relation to S50 above, the storage device 10 may perform a garbage collection operation. The garbage collection operation for the storage device 10 may include selecting a sacrificial block from memory blocks (e.g., BLK1 to BLKn of FIG. 3), copying a valid page from the sacrificial block to a free memory block, and then erasing the sacrificial block. Subsequently, the erased sacrificial block may be reused as a free memory block.

The storage device 10 may then determine whether the power disable signal has been inactivated (S60). When the power disable signal is in an activated state (S60=NO), the storage device 10 may again return to S20. Accordingly, the storage device 10 may periodically power on the processor 110 and perform a data recovery operation without intervention by the host device 200 during a power disable function activation mode.

However, when the power disable signal is inactivated (S60=YES), the storage device 10 may power on the storage controller 100 (S70). For example, when the power disable signal changes from a high level to a low level, the storage device 10 may determine that the power disable signal PWDIS is inactivated. Accordingly, during S70, the power supply circuit 300 may provide the first internal voltage IV1 to the processor 110 through the first internal power line PL1 and provide the second internal voltage IV2 to the host interface 120 through the second internal power line PL2.

Figure 5:
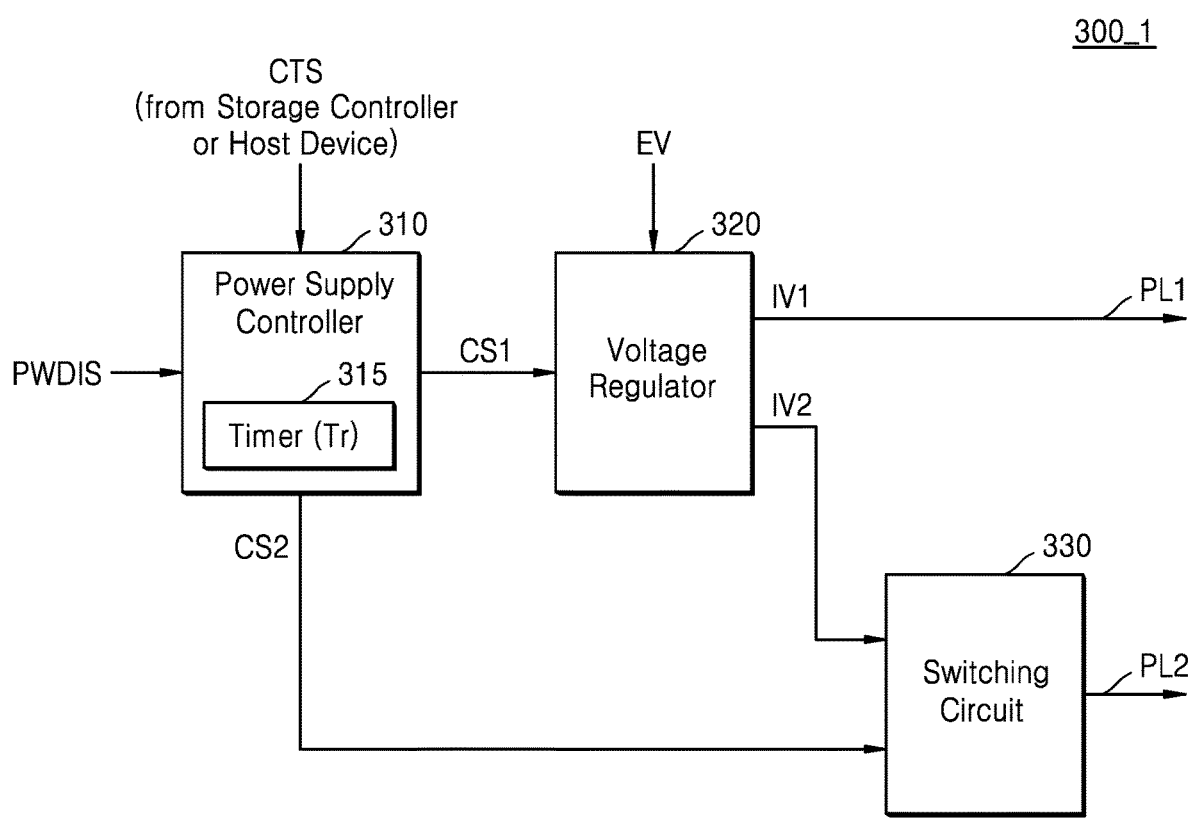
FIG. 5 is a block diagram further illustrating in one example (300_1) the power supply circuit 300 of FIG. 1 according to embodiments of the inventive concept.

FIG. 5 is a block diagram further illustrating in one example (300_1) the power supply circuit 300 of FIG. 1 according to embodiments of the inventive concept.

Referring to FIGS. 1, 2 and 5, the power supply circuit 300_1 may include a power supply controller 310, a voltage regulator 320, and a switching circuit 330, where the power supply controller 310 may include a timer 315.

The power supply controller 310 may receive a power disable signal (PWDIS) through a third external power line.

In an example embodiment, the power supply controller 310 may receive at least one external voltage (EV) through at least one of the first external power line and the second external power line. Alternately, the power supply controller 310 may receive an operating voltage from the voltage regulator 320.

The power supply controller 310 may be used to generate a first control signal CS1 and a second control signal CS2 in response to the power disable signal. When the power disable signal PWDIS is inactivated, the power supply controller 310 may provide the first control signal CS1 to the voltage generator 320 such that the voltage regulator 320 generates a first internal voltage IV1 and a second internal voltage IV2, and may provide the second control signal CS2 to the switching circuit 330 such that the switching circuit 330 transmits a second internal voltage IV2 to a second internal power line PL2.

When the power disable signal is activated, the power supply controller 310 may provide the first control signal CS1 to the voltage regulator 320 such that the voltage regulator 320 does not generate the first internal voltage IV1 and the second internal voltage IV2. When a reference time Tr has elapsed following the power off time (e.g., following activation of the power disable signal), the power supply controller 310 may generate the first control signal CS1 such that the voltage regulator 320 again generates the first internal voltage IV1 and the second internal voltage IV2. In this case, the power supply controller 310 may provide the second control signal CS2 such that the second internal voltage IV2 is not transmitted by the switching circuit 330 to the second internal power line PL2 (i.e., is interrupted). Accordingly, when the reference time Tr has elapsed following activation of the power disable signal, the first internal voltage IV1 may be provided to the processor 110, but the second internal voltage IV2 is not provided to the host interface 120 (i.e., is interrupted).

The timer 315 of the power supply controller 310 may be used to determine (e.g., count) an elapsed time from the power off time for the storage controller 100. For example, the timer 315 may count an elapsed time from a point in time at which the power disable signal is activated. Alternatively, the timer 315 may count an elapsed time from a point in time at which a data recovery operation is completed during the power disable function activation mode. That is, during the power disable function activation mode, after the data recovery operation is completed, when the storage controller 100 is powered off, the timer 315 may be reset. The power supply controller 310 may generate the first control signal CS1 and the second control signal CS2, based a comparison result between a predetermined reference time Tr and the elapsed time counted by the timer 315.

In this regard, the power supply controller 310 may receive a time setting signal (CTS) and set the reference time (Tr) in response to the time setting signal. In an example embodiment, the power supply controller 310 may receive the time setting signal from the storage controller 100. For example, information about the reference time Tr may be stored in the RAM 130, and the processor 110 may drive firmware, generate the time setting signal based on the information about the reference time stored in the RAM 130, and transmit the time setting signal to the power supply controller 310. Alternatively, for example, the storage controller 100 may receive a signal including the information about the reference time from the host device 20, and the processor 110 may drive firmware and transmit the time setting signal to the power supply controller 310.

Alternatively, in an example embodiment, the power supply controller 310 may directly receive the time setting signal from the host device 20. For example, the time setting signal may be included in the power disable signal. That is, when the power disable signal has a specific pattern, the power supply controller 310 may set a reference time corresponding to the specific pattern. In this manner, the power supply controller 310 may receive both the power disable signal and the time setting signal from the host device 20 through the same external power line (e.g., the third external power line).

In an example embodiment, the power supply controller 310 may store a lookup table (e.g., LUT of FIG. 6A or LUTa of FIG. 6B) including information regarding the reference time in response to the time setting signal in order to set the reference time.

However, the operation of the power supply controller 310 is not limited to receiving the time setting signal. For example, the reference time may be set in the power supply controller 310, and the power supply controller 310 may generate the first control signal CS1 and the second control signal CS2 in response to the reference time.

Further in this regard, the power supply controller 310 may adaptively change the duration of the reference time in response to (e.g.,) a change in data reliability for the storage device 10. For example, when it is determined that a data recovery operation is unnecessarily being performed too frequently during the power disable function activation mode, the power supply controller 310 may increase the reference time (e.g., Tr+ΔTra). In contrast, when a number of read errors increases due to an increase in data retention time, the power supply controller 310 may reduce the reference time Tr (e.g., Tr+ΔTrb), such that the frequency of data recovery operations may be increased during the power disable function activation mode.

When the first internal voltage IV1 is provided to the processor 110 while the power disable signal is activated, the processor 110 may perform a data recovery operation. When the data recovery operation is completed, the power supply controller 310 may again provide the first control signal CS1 so that the voltage regulator 320 does not generate the first internal voltage IV1 and the second internal voltage IV2.

The voltage regulator 320 may be selectively activated in response to the first control signal CS1. The voltage regulator 320 may receive the external voltage EV and generate the first internal voltage IV1 and the second internal voltage IV2. The first internal voltage IV1 may be an operating voltage of the processor 110, and the second internal voltage IV2 may be an operating voltage of the host interface 120. The voltage regulator 320 may provide the first internal voltage IV1 to a first internal power line PL1 and provide the second internal voltage IV2 to the switching circuit 330. In an example embodiment, the first internal voltage IV1 and the second internal voltage IV2 may have the same voltage level. However, the inventive concept is not limited thereto, and the first internal voltage IV1 and the second internal voltage IV2 may have different voltage levels.

The switching circuit 330 may receive the second internal voltage IV2 from the voltage regulator 320 and provide the second internal voltage IV2 to the second internal power line PL2 in response to the second control signal CS2. In an example embodiment, the switching circuit 330 may include a multiplexer.

Figure 6A:
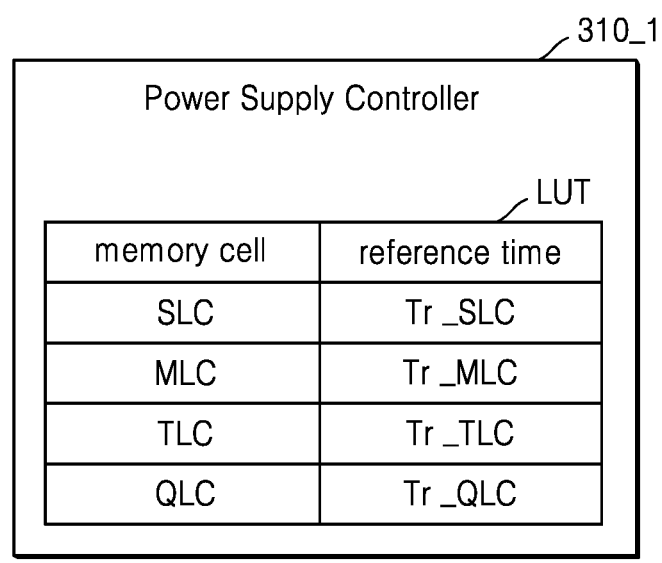
FIGS. 6A and 6B are respective block diagrams illustrating in various examples (300_1 and 300_2) the power supply controller 310 of FIG. 5 according to embodiments of the inventive concept.
Figure 6B:
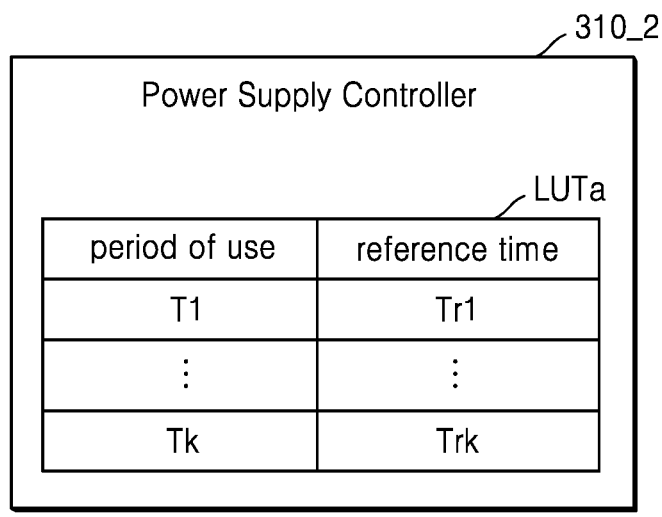

FIGS. 6A and 6B are respective block diagrams illustrating in various examples (310_1 and 310_2) the power supply controller 310 of FIG. 5 according to embodiments of the inventive concept.

Referring to FIGS. 1 and 6A, a plurality of reference times having different values may be stored in the power supply controller 310. For example, a lookup table LUT including information about a reference time corresponding to memory cell characteristics may be stored in the power supply controller 310. However, the inventive concept is not limited to a case in which the power supply controller 310 stores the lookup table LUT. The power supply controller 310 may store information about the reference time corresponding to the memory cell characteristics in various manners.

In an example embodiment, the non-volatile memory 200 may include one or more memory device(s) including one or more SLC, 2-bit MLC (or MLC), 3-bit MLC (or TLC), and/or 4-bit MLC (or QLC). A first reference time (Tr_SLC) corresponding to the SLC, a second reference time (Tr_MLC) corresponding to the 2-bit MLC, a third reference time (Tr_TLC) corresponding to the TLC, and/or a fourth reference time (Tr_QLC) corresponding to the QLC may be stored in the lookup table LUT associated with the power supply controller 310.

In example embodiments, the first reference time may be longer than the second reference time, the second reference time may be longer than the third reference time, and the third reference time may be longer than the fourth reference time. That is, as the number of bits stored in various memory cell increases, a corresponding reference time for the memory cell may be reduced. As the number of bits stored in one memory cell increases, a read error due to the charge leakage in the memory cell may occur more easily. Accordingly, as the number of bits stored in the memory cell increases, the reference time corresponding to the memory cell may be reduced, and thus, a data recovery operation may be performed according to a shorter cycle for the memory device. As a result, read error(s) due to the charge leakage may be reduced or prevented.

The timer 315 may be used to count elapsed time(s) respectively corresponding to the first, second, third and fourth reference times. For example, the timer 315 may include a first timer corresponding to the SLC and a second timer corresponding to the MLC. In a power disable function activation mode, when a data recovery operation on the memory device including SLC is completed, the first timer may be reset, and when a data recovery operation on the memory device including MLC is completed, the second timer may be reset. That is, a storage device according to embodiments of the inventive concept may independently perform operations S10 to S70 described in relation to FIG. 4 on each of memory device(s) including SLC, MLC, TLC and/or QLC.

As previously noted, the non-volatile memory 200 may include one or more memory device(s) including SLC, MLC, TLC and/or QLC. However, in contrast to the embodiment described in relation to FIG. 6, a reference time corresponding to the one or more memory device(s) included in the non-volatile memory 200 may be stored in the power supply controller 310.

Referring to FIGS. 1 and 6B, a plurality of reference times having different values may be stored in the power supply controller 310_2. For example, a lookup table LUTa including information about a reference time corresponding to a period of use for the storage device may be stored in the power supply controller 310_2.

In an example embodiment, as the period of use for the storage device increases, a reference time stored in the lookup table LUTa may have a smaller value. For example, when a period of use for the storage device is less than or equal to a threshold period of use T1, the reference time may have a first value Tr1. When the period of use for the storage device is less than or equal to a k-th period Tk, the reference time may have a k-th value Trk. In this case, 'k' may be a natural number greater than or equal to 2. The k-th value Trk may be less than the first value Tr1.

As the period of use for the storage device increases, read errors due to charge leakage for data stored in the memory cell may occur more easily. Accordingly, as the period of use for the storage device increases, the reference time may be reduced. As a result, a data recovery operation may be performed relatively more frequently, and the occurrence of read errors due to charge leakage may be reduced or prevented.

However, the power supply controller 310_2 is not limited to storing the lookup table LUTa and may store the information about the reference time corresponding to the period of use in various manners. For instance, a relationship between a period of use and variation in reference time may be stored in the power supply controller 310_2, and the power supply controller 310_2 may calculate a reference time corresponding to a period of use based on the relationship.

Figure 7:
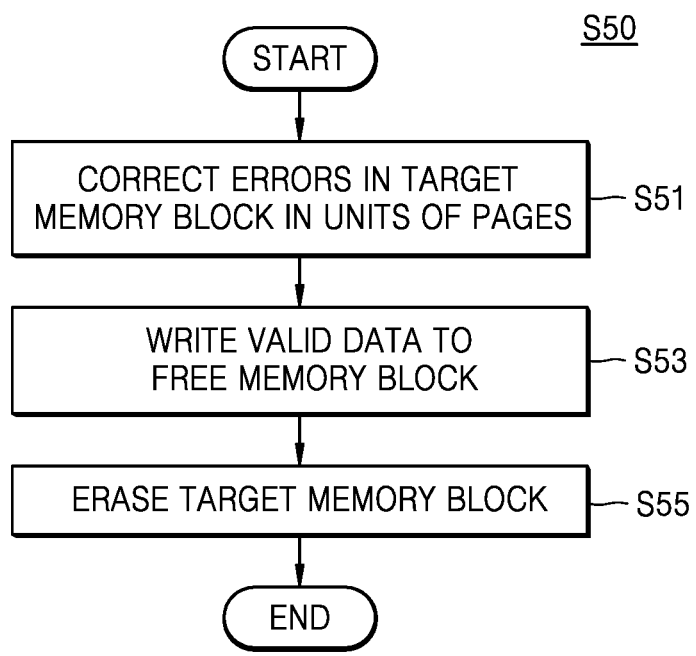
FIG. 7 is a flowchart summarizing in one example a method of operating a storage device according to embodiments of the inventive concept.

FIG. 7 is a flowchart further summarizing in one example the operation S50 of FIG. 4 according to embodiments of the inventive concept. Here, a data recovery operation performed in relation to a target memory block (S50) is assumed to include operations (S51), (S53) and (S55).

Referring to FIGS. 1, 4 and 7, the storage device 10 may correct error(s) in the target memory block, wherein data is stored in page units (SM). For example, the storage device 10 may read user data and an ECC parity corresponding thereto from a page of the target memory block and perform an error correction operation using the ECC parity.

The storage device 10 may determine whether a detected error in data is correctable. For example, the storage device 10 may determine that an error in data is uncorrectable in a page in which a number of failed bits detected in data exceeds the particular error correction capability of the storage device 10.

In an example embodiment, when the error in data is uncorrectable, the storage device 10 may further perform a RAID recovery operation. The storage device 10 may read data and a RAID parity, which are included in a RAID stripe, from cell regions other than a cell region including the page in which an error is determined to be uncorrectable, and perform a RAID recovery operation using the data and RAID parity, which are read. Thus, recovered data may be output using the RAID recovery operation.

The storage device 10 may then write valid data, among data stored in the target memory block, to a free memory block (S53). For example, the storage device 10 may determine that certain uncorrectable data (S51) is invalid data, and may further determine that certain correctable data is valid data (SM). In an example embodiment, even when the error in data is uncorrectable, the data that is recovered due to the RAID recovery operation may be valid data.

Because valid data is written to the free memory block, the target memory block may be changed to the free memory block in a mapping table corresponding to the valid data. A page address may also be changed according to the number of valid pages to which valid data in the target memory block is written.

The storage device 10 may then erase data stored in the target memory block (S55) When all valid data, from among the data stored in the target memory block, is written to the free memory block (S53), the storage device 10 may perform (S55). The target memory block from which the data is erased may become a new free memory block that may be reused.

Figure 8:
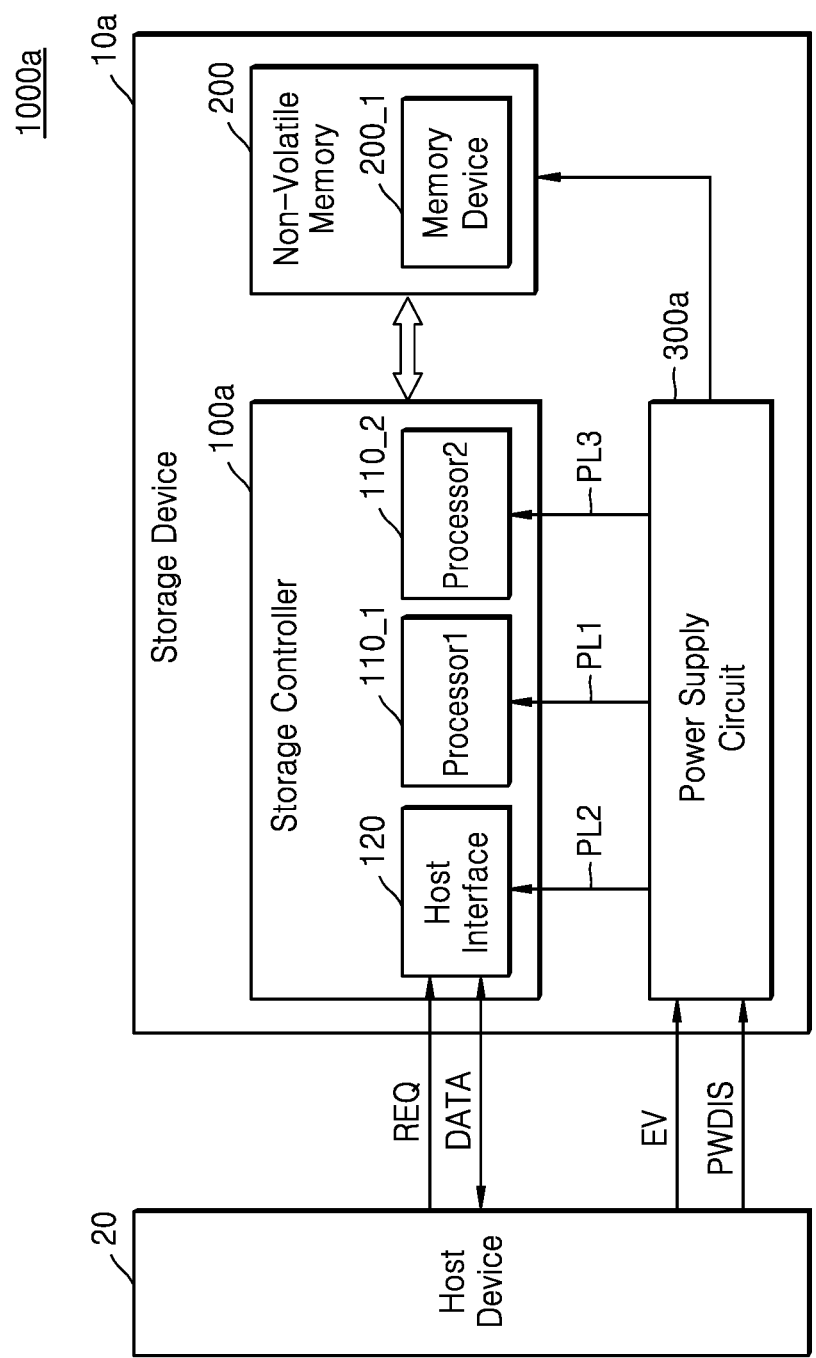
FIG. 8 is a block diagram illustrating in one example (1000a) a storage system according to embodiments of the inventive concept.
Figure 9:
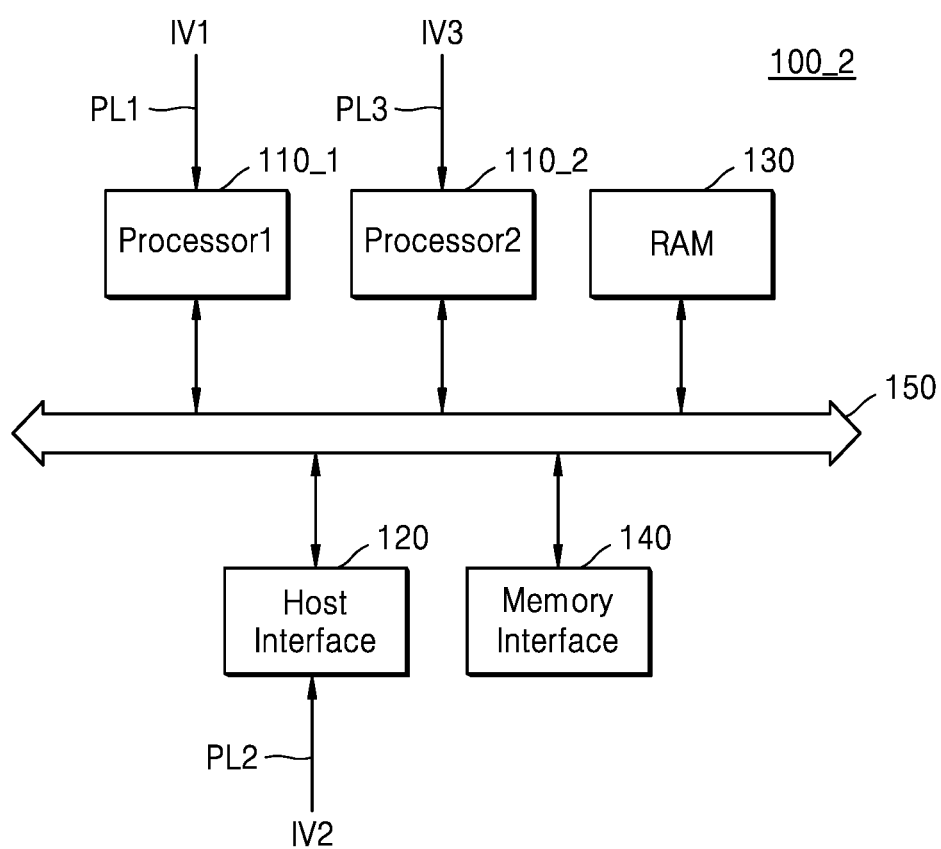
FIG. 9 is a block diagram illustrating in one example (100_2) the storage controller 100a of FIG. 9 according to embodiments of the inventive concept.

FIG. 8 is a block diagram illustrating in one example (1000a) a storage system according to embodiments of the inventive concept, and FIG. 9 is a block diagram illustrating in one example (100_2) the storage controller 100a of FIG. 8 according to embodiments of the inventive concept.

Referring to FIG. 8, the storage system 1000a may generally include a storage device 10a and the host device 20, where the host device 20 may communicate with the storage device 10a through a host interface 120.

A power supply circuit 300a may be used to generate internal voltage(s) from one or more external voltages (EV) and required for respective operation(s) of the storage controller 100a and the non-volatile memory 200. For example, the power supply circuit 300a may provide the first internal voltage to a first processor 110_1 through the first power line PL1, the second internal voltage to the host interface 120 through the second power line PL2, and a third internal voltage to the second processor 110_2 through the third power line PL3.

When a power disable signal (PWDIS) is activated, the power supply circuit 300a may not provide internal voltages to the storage controller 100a and the non-volatile memory 200, respectively, and power off the storage controller 100a and the non-volatile memory 200. For example, when the power supply circuit 300a receives a high-level power disable signal, the power supply circuit 300a may power off the storage controller 100a and the non-volatile memory 200. In contrast, when the power supply circuit 300a receives a low-level power disable signal, the power supply circuit 300a may provide internal voltages to the storage controller 100a and the non-volatile memory 200, respectively, and power on the storage controller 100a and the non-volatile memory 200.

After the power supply circuit 300a powers off the storage controller 100a and the non-volatile memory 20 in response to the activated power disable signal, when a reference time elapses, the power supply circuit 300a of the storage device 10a may temporarily power on the first processor 110_1. For example, when the power supply circuit 300a receives the activated power disable signal, the power supply circuit 300a may not provide the internal voltages to the storage controller 100a and the non-volatile memory 200 for the reference time. When the reference time has elapsed, the power supply circuit 300a may provide the first internal voltage to the first processor 110_1 through the first power line PL1. Accordingly, even when a power disable function is activated, the storage device 10a may periodically provide the first internal voltage to the first processor 110_1, and thus, the first processor 110_1 may perform a data recovery operation on the non-volatile memory 200 during the application of the first internal voltage to the first processor 110_1. Read errors caused by retention errors that may occur when the storage device 10a is maintained in a power-off state may be reduced, and the lifespan of the storage device 10a may be increased.

Referring to FIG. 9, the storage controller 100a may include the first processor 110_1, the second processor 110_2, the host interface 120, the RAM 130, and the memory interface 140. The first processor 110_1, the second processor 110_2, the host interface 120, the RAM 130, and the memory interface 140 may communicate with each other through the bus 150. Although the first processor 110_1 and the second processor 110_2 are illustrated as separate components in FIG. 8, the storage controller 100a according to the present embodiment is not limited thereto, and the first processor 110_1 and the second processor 110_2 may constitute one processor and perform respectively different operations in the storage controller 100a.

The first processor 110_1 may be an additional core processor configured to perform a data recovery operation when the power disable function of the storage controller 100a is activated. For instance, the first processor 110_1 may be a programmable logic device (PLD). In an example embodiment, the first processor 110_1 may have lower power consumption than the second processor 110_2.

The second processor 110_2 may be a controller configured to control the overall operation of the storage controller 100a. The second processor 110_2 may include a CPU or an MP. The second processor 110_2 may drive firmware for driving the storage controller 100a. The firmware may be loaded in the RAM 130 and driven. Accordingly, when the power disable function is inactivated, the second processor 110_2 may drive firmware loaded in the RAM 130 and perform a data recovery operation.

The first processor 110_1 may receive a first internal voltage IV1 from a power supply circuit (e.g., 300a of FIG. 9) through the first internal power line PL1, and the second processor 110_2 may receive a third internal voltage IV3 from the power supply circuit 300a through the third internal power line PL3. The host interface 120 may receive a second internal voltage IV2 from the power supply circuit 300a through the second internal power line PL2. In an example embodiment, the first internal voltage IV1 and the third internal voltage IV3 may have the same voltage level. However, the inventive concept is not limited thereto, and the first internal voltage IV1 and the third internal voltage IV3 may have different voltage levels.

When the power disable function is activated, the first to third internal voltages IV1, IV2, and IV3 supplied to the first processor 110_1, the second processor 110_2, and the host interface 120 may be blocked. In an example embodiment, when the reference time has elapsed after the activation of the power disable function, the first internal voltage IV1 may be temporarily supplied to the first processor 110_1, and the second internal voltage IV2 and the third internal voltage IV3, which are supplied to the host interface 120 and the second processor 110_2, may be interrupted. Accordingly, the host device 20 may recognize the power disable function of the storage device 10a as being activated and simultaneously, a data recovery operation may be periodically performed inside the storage device 10a. The storage device 10a may be prevented from deteriorating due to an increase in retention time of the non-volatile memory 200, which may occur when the storage device 10a is put into a power-off state.

The RAM 130 may operate via the control of the first processor 110_1 and the second processor 110_2. In an example embodiment, the RAM 130 may be used as a buffer memory and temporarily store data. For example, the data temporarily stored in the RAM 130 may be written to the non-volatile memory 200 or transmitted to the host device 20. In a power disable function activation mode, the first processor 110_1 may recover data of a target memory block, temporarily store the data in the RAM 130, and then rewrite the data to the target memory block again. However, the inventive concept is not limited thereto, and the first processor 110_1 may further include a buffer memory directly connected thereto without using the bus 150. Thus, in the power disable function activation mode, the first processor 110_1 may perform a data recovery operation by using the buffer memory directly connected thereto.

Figure 10:
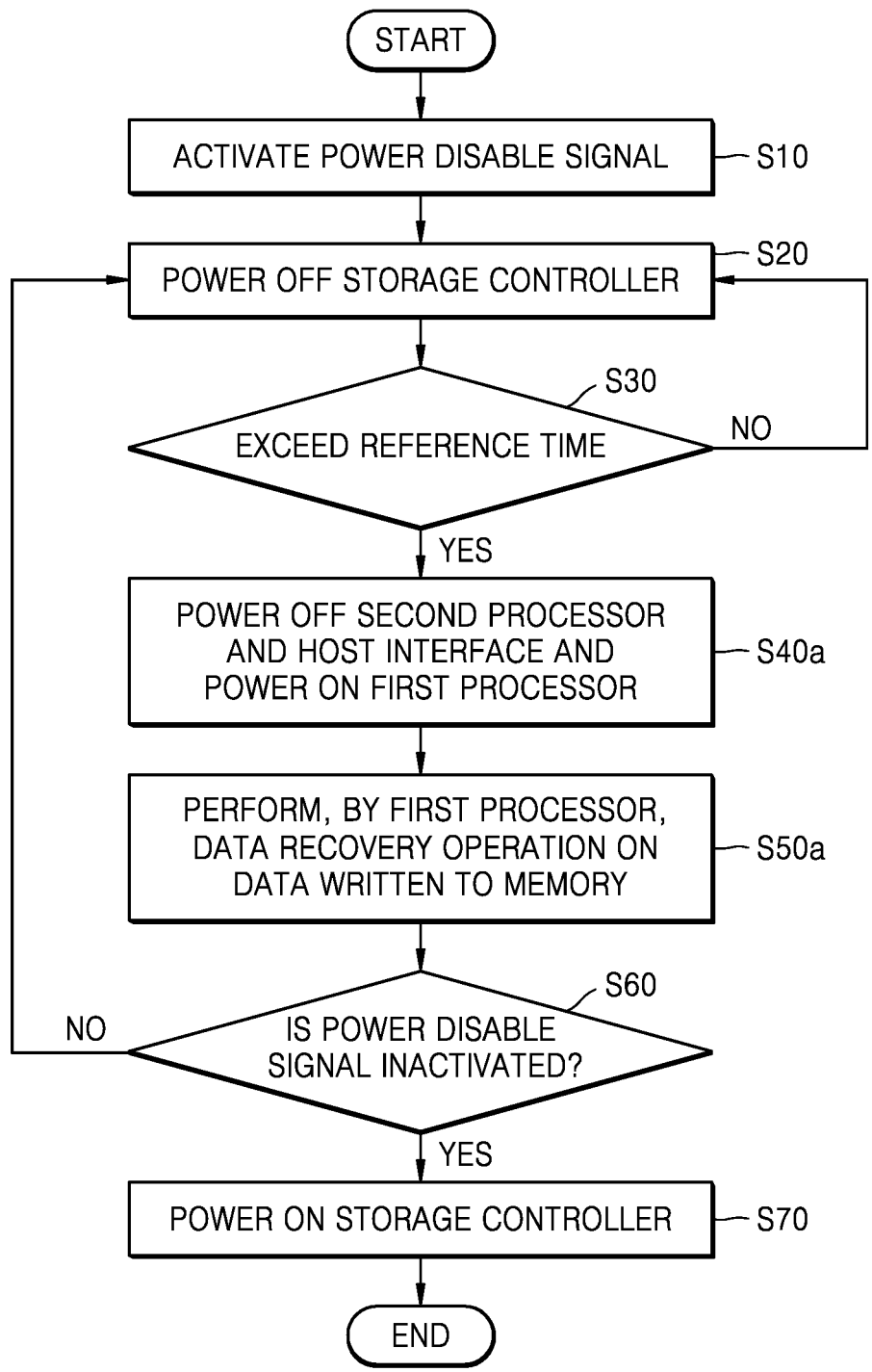
FIG. 10 is a flowchart summarizing in one example a method of operating a storage device according to embodiments of the inventive concept.

FIG. 10 is a flowchart summarizing in one example a method of operating a storage device 10a according to embodiments of the inventive concept. Here, the method of FIG. 10 is substantially similar to the method of FIG. 4, except operations S40 and S50 are respectively replaced by operations S40a and S50a.

Referring to FIGS. 8, 9 and 10, following the execution of operations S10 and S20, and upon determining that the reference time has been exceeded (S30=YES), the storage device 10a may maintain the power off state of the second processor 110_2 but power on the first processor 110a (S40a). That is, the power supply circuit 300a may temporarily provide the first internal voltage IV1 to the first processor 110_1 through the first internal power line PL1, but not provide the second internal voltage IV2 or the third internal voltage IV3 to the host interface 120 and the second processor 110_2, respectively. Because the host interface 120 is maintained in a power-off state, the host device 20 may determine that a power enable function of the storage device 10a is activated. In this manner, power consumption may be reduced by powering off the second processor 110_2 that is not used during the data recovery operation.

Then, the storage device 10a may perform the data recovery operation on data written to the non-volatile memory 200 (S50a). Because the first processor 110_1 is powered on in operation S40a, the data recovery operation may be performed using the first processor 110_1. For example, power consumption caused by a data recovery operation performed by the first processor 110_1 may be lower than power consumption caused by a data recovery operation performed by the second processor 110_2. Accordingly, because the storage device 10a according to the present embodiment includes the first processor 110_1 as an additional processor configured to internally perform a data recovery operation in a power disable function activation mode, power consumption caused by the data recovery operation may be relatively reduced.

Figure 11:
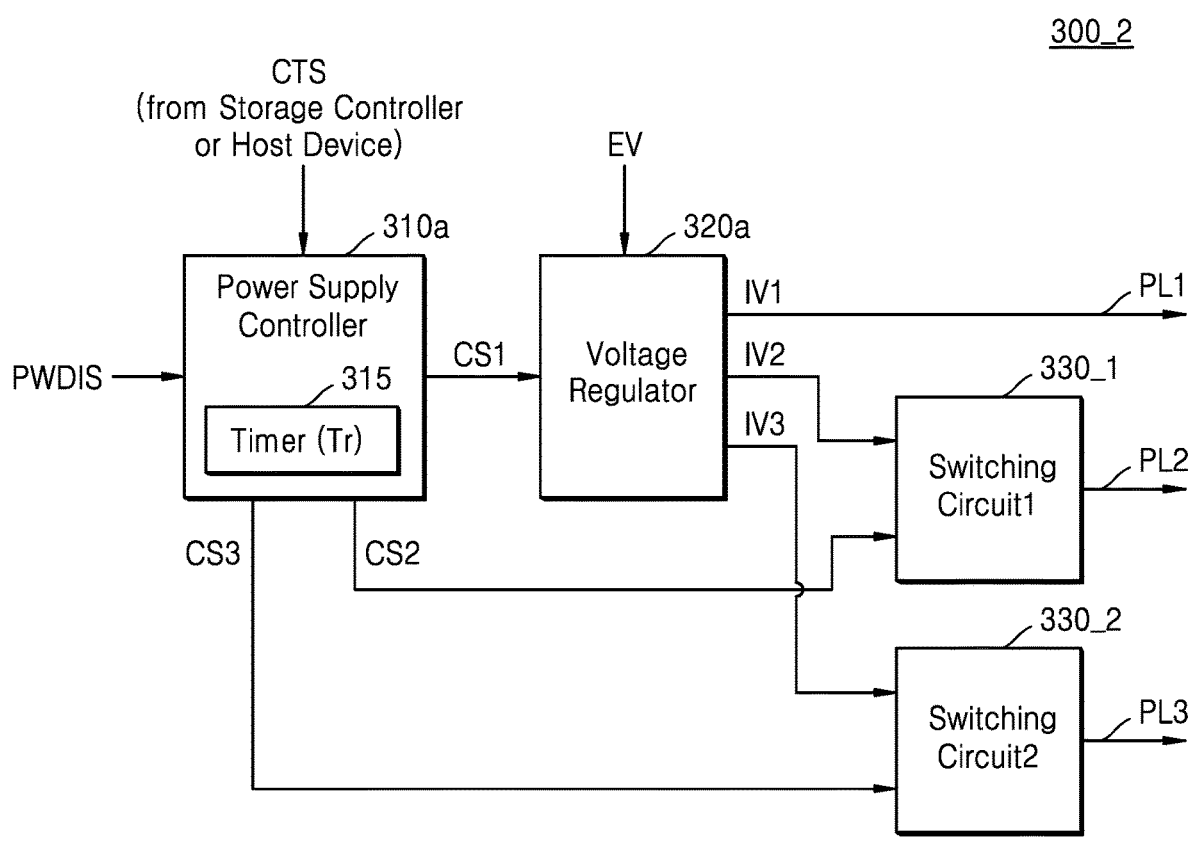
FIG. 11 is a block diagram illustrating in one example (300_2) the power supply circuit 300a of FIG. 9 according to embodiments of the inventive concept.

FIG. 11 is a block diagram further illustrating in one example (300_2) the power supply circuit 300a of FIG. 8 according to embodiments of the inventive concept.

Referring to FIGS. 8 and 11, the power supply circuit 300_2 may include a power supply controller 310a, a voltage regulator 320a, a first switching circuit 330_1, and a second switching circuit 330_2, wherein the power supply controller 310a may include the timer 315.

Here, the power supply controller 310a may be used to generate first, second and third control signals CS1, CS2 and CS3 in response to the power disable signal. In an example embodiment, the power supply controller 310a may generate the first, second and third control signals CS1, CS2 and CS3 based on a comparison result between a predetermined reference time (Tr) and an elapsed time counted by the timer 315.

In an example embodiment, at least one of the lookup table LUT of FIG. 6A and the lookup table LUTa of FIG. 6B may be used in the power supply controller 310a. That is, the power supply controller 310a may store reference time information corresponding to memory cell characteristics and store the reference time information corresponding to period(s) of use for the storage device.

When the power disable signal is inactivated, the power supply controller 310a may provide the first control signal CS1 to the voltage regulator 320a, such that the voltage regulator 320a generates first, second and third internal voltages IV1, IV2 and IV3. When the power disable signal is inactivated, the power supply controller 310a may provide the second control signal CS2 to the first switching circuit

330_1, such that the first switching circuit 330_1 transmits the second internal voltage IV2 to a second internal power line PL2. Also, when the power disable signal is inactivated, the power supply controller 310a may provide the third control signal CS3 to the second switching circuit 330_2, such that the second switching circuit 330_2 transmits the third internal voltage IV3 to a third internal power line PL3.

When the power disable signal is activated, the power supply controller 310a may provide the first control signal CS1 to the voltage regulator 320a, such that the voltage regulator 320a does not provides (i.e., interrupts) the first, second and third internal voltages IV1, IV2 and IV3. When the reference time has elapsed after the activation of the power disable signal, the power supply controller 310a may again generate the first control signal CS1, such that the voltage regulator 320a generates the first, second and third internal voltages IV1, IV2 and IV3. In this case, the power supply controller 310a may provide the second control signal CS2 to the first switching circuit 330_1, such that the second internal voltage IV2 is interrupted by the first switching circuit 330_1 to the second internal power line PL2. Also, the power supply controller 310a may provide the third control signal CS3 to the second switching circuit 330_2, such that the third internal voltage IV3 is interrupted to the third internal power line PL3. Accordingly, when the reference time has elapsed after the activation of the power disable signal, the first internal voltage IV1 may be provided to the first processor 110_1, the second internal voltage IV2 may not be provided (i.e., is interrupted) to the host interface 120, and the third internal voltage IV3 may not be provided (i.e., is interrupted) to the second processor 110_2.

When the first internal voltage IV1 is provided to the first processor 110_1 while the power disable signal is being activated, the first processor 110_1 may perform the data recovery operation. When the data recovery operation is completed, the power supply controller 310a may again provide the first control signal CS1 to the voltage regulator 320a, such that the voltage regulator 320a interrupts the first, second and third internal voltages IV1, IV2 and IV3. In storage devices according to embodiments of the inventive concept, while the power disable signal is activated, power may be provided to the first processor 110_1, while interrupting power to the second processor 110_2. In this manner, the data recovery operation may be executed using the first processor 110_1, yet relatively little power is consumed.

The voltage regulator 320a may be selectively activated in response to the first control signal CS1. The voltage regulator 320a may receive an external voltage EV and generate the first to third internal voltages IV1 to IV3. The first internal voltage IV1 may be an operating voltage of the first processor 110_1, the second internal voltage IV2 may be an operating voltage of the host interface 120, and the third internal voltage IV3 may be an operating voltage of the second processor 110_2.

The first switching circuit 330_1 may receive the second internal voltage IV2 from the voltage regulator 320a and provide the second internal voltage IV2 to the second internal power line PL2 in response to the second control signal CS2. The second switching circuit 330_2 may receive the third internal voltage IV3 from the voltage regulator 320a and provide the third internal voltage IV3 to the third internal power line PL3 in response to the third control signal CS3. In an example embodiment, each of the first switching circuit 330_1 and the second switching circuit 330_2 may include a multiplexer.

Figure 12:
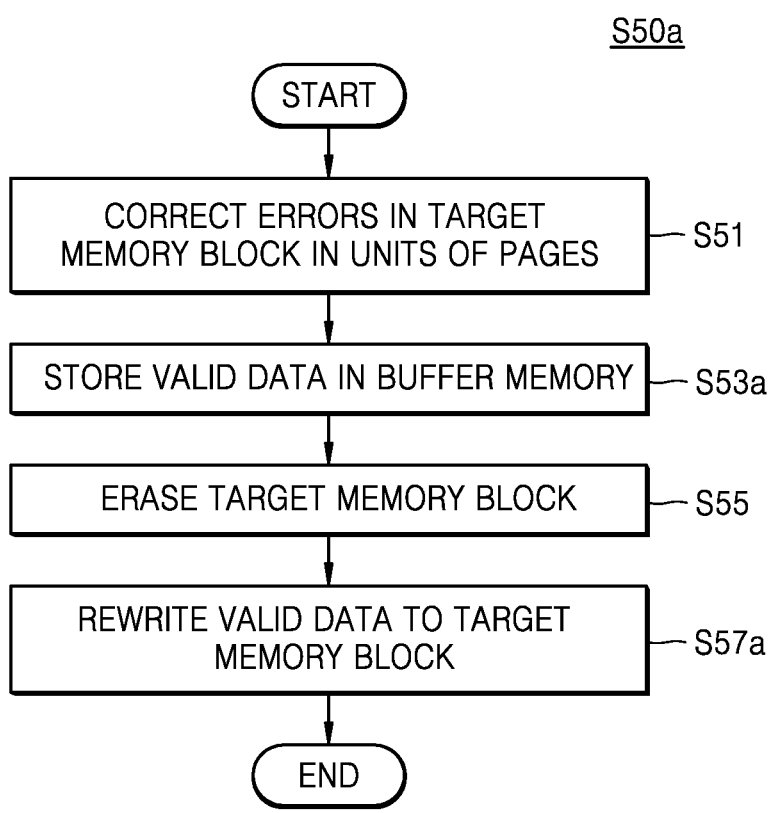
FIG. 12 is a flowchart summarizing in one example a method of operating a storage device according to embodiments of the inventive concept.

FIG. 12 is a flowchart summarizing the operation S50a, which is another example of the operation S50 of FIG. 7 according to embodiments of the inventive concept. Here, a data recovery operation performed in relation to a target memory block (S50a) is assumed to include operations (S51) and (S55), as described in relation to the method of FIG. 7. However, operation (S53a) replaces operation (S53) and new operation (S57a) is added.

Referring to FIGS. 7, 8, 9 and 12, after the storage device 10a corrects error(s) in the data stored in the target memory block (e.g., using ECC parity corresponding to the data of the target memory block), the storage device 10a may store valid data, from data stored in the target memory block, in a buffer memory (S53a). For example, the storage device 10a may store valid data, in the RAM 130. However, the storage device 10a is not limited thereto but may further include a buffer memory directly connected to the first processor 110_1, and valid data may be stored in the buffer memory.

In an example embodiment, the storage device 10a may determine that data of which an error is uncorrectable is invalid data. It may be determined that data in which an uncorrectable ECC (UECC) error has occurred is invalid data.

Then, the storage device 10a may erase the data stored in the target memory block (S55). That is, when all valid data, from among the data stored in the target memory block, is stored in the buffer memory block (S53a), the storage device 10a may perform operation S55.

Then, the storage device 10a may rewrite the valid data stored in the buffer memory to the target memory block (S57a). Here, because the valid data is rewritten to the target memory block, a memory block address need not be changed in a mapping table.

The method S50a described in relation to FIG. 12 may relate to a data recovery method performed by the first processor 110_1 on the target memory block when a power disable function of the storage device 10a is activated. When the power disable function of the storage device 10a is inactivated, the data recovery operation described in operation S50 of FIG. 7 may be performed by the second processor 110_2.

While the inventive concept has been particularly shown and described with reference to embodiments thereof, it will be understood that various changes in form and details may be made therein without departing from the spirit and scope of the following claims.

What is claimed is:
1. A storage device comprising:
a power supply circuit that receives a power disable signal from a host device and provides a first internal voltage and a second internal voltage;
a non-volatile memory including a memory device; and
a storage controller that controls the non-volatile memory and includes a processor that performs a data recovery operation on data stored in the memory device and a host interface that communicates with the host device, wherein
when the power disable signal is activated at a power off time, the storage controller is powered off, the power supply circuit interrupts the first internal voltage and the second internal voltage during a reference time following the power off time, and provides the first internal voltage to the processor after the reference time has elapsed following the power off time.
2. The storage device of claim 1, wherein the power supply circuit sets the reference time in response to a time setting signal received from the storage controller.

3. The storage device of claim 1, wherein the power supply circuit sets the reference time in response to a time setting signal received from the host device.

4. The storage device of claim 3, wherein the power supply circuit receives the power disable signal and the time setting signal from the host device through a same external power line.

5. The storage device of claim 1, wherein the power supply circuit comprises:
a power supply controller that generates a first control signal and a second control signal in response to the power disable signal;
a voltage regulator that generates the first internal voltage and the second internal voltage in response to the first control signal; and
a switching circuit that interrupts the second internal voltage in response to the second control signal.

6. The storage device of claim 5, wherein the power supply controller further comprises:
a timer that counts an elapsed time from the power off time,
wherein the power supply controller compares the elapsed time with the reference time to generate a comparison result and generates the first control signal and the second control signal in response to the comparison result.

7. The storage device of claim 5, wherein the power supply controller stores a plurality of reference times and one of the plurality of reference times is selected as the reference time.

8. The storage device of claim 7, wherein each one of the plurality of reference times corresponds to a different period of use for the storage device.

9. The storage device of claim 8, wherein the plurality of reference times includes a first reference time corresponding to a period of use less than a threshold period of use, and a second reference time corresponding to a period of use greater than the threshold period of use.

10. A method of operating a storage device including a non-volatile memory and a storage controller, the non-volatile memory including a memory device, and the storage controller including a processor and a host interface, the method comprising:
upon receiving an activated power disable signal from a host device at a power off time, powering off the storage controller to place the processor and the host interface in a power off state;
determining whether a reference time has elapsed following the power off time; and
upon determining that the reference time has elapsed following the power off time, providing an internal voltage to the processor to place the processor in a power on state such that the processor performs a data recovery operation on data stored in the memory device, and maintaining the power off state of the host interface.

11. The method of claim 10, wherein the data recovery operation comprises:
correcting errors in data stored in a target memory block of the memory device;
writing valid data, from among the data stored in the target memory block, to a free memory block of the memory device; and
generating another free memory block by erasing the target memory block.

12. The method of claim 11, wherein the correcting of errors in the data stored in the target memory block of the memory device is performed in page units.

13. The method of claim 10, wherein the data recovery operation comprises:
correcting errors in data stored in a target memory block of the memory device;
storing valid data, from among the data stored in the target memory block, to a buffer memory;
erasing the target memory block; and
rewriting the valid data from the buffer memory to the target memory block after the erasing.

14. The method of claim 10, further comprising:
receiving a time setting signal from the host device; and
setting the reference time in response to the time setting signal.

15. The method of claim 14, wherein the power disable signal includes the time setting signal.

16. A method of operating a storage device including a non-volatile memory and a storage controller, the storage controller including a processor and a host interface, the method comprising:
receiving a power disable signal from a host device; and
operating the storage device in a power disable function activation mode when the power disable signal is activated and operating the storage device in a power disable function inactivation mode when the power disable signal is inactivated,
wherein the operating of the storage device in the power disable function activation mode comprises
powering off the processor and the host interface at a power off time,
powering on the processor after a reference time has elapsed following the power off time,
using the processor to perform a data recovery operation on data stored in the non-volatile memory, and
powering off the processor when the data recovery operation is completed.

17. The method of claim 16, wherein the data recovery operation comprises:
correcting errors in data stored in a target memory block of the non-volatile memory;
writing valid data, from among the data stored in the target memory block, to a free memory block of the non-volatile memory; and
generating another free memory block by erasing the target memory block.

18. The method of claim 16, wherein the data recovery operation comprises:
correcting errors in data stored in a target memory block of the non-volatile memory;
storing valid data, from among the data stored in the target memory block, in a buffer memory;
erasing the target memory block; and
rewriting the valid data from the buffer memory to the target memory block after the erasing.

19. The method of claim 16, wherein the operating of the storage device in the power disable function inactivation mode further comprises performing a data recovery operation for data stored in the non-volatile memory by correcting errors in data stored in a target memory block of the non-volatile memory, writing valid data, from among the data stored in the target memory block, to a free memory block of the non-volatile memory, and generating another free memory block by erasing the target memory block.

20. The method of claim 16, wherein the operating of the storage device in the power disable function activation mode comprises:
  receiving a time setting signal from the host device; and
  setting the reference time in response to the time setting signal.

\* \* \* \* \*